US012750022B2

(12) United States Patent
Morikoshi

(10) Patent No.: US 12,750,022 B2
(45) Date of Patent: Sep. 29, 2026

(54) DIFFERENTIAL AMPLIFIER CIRCUIT

(71) Applicant: Renesas Electronics Corporation, Tokyo (JP)

(72) Inventor: Nobuyuki Morikoshi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 497 days.

(21) Appl. No.: 18/359,116

(22) Filed: Jul. 26, 2023

(65) Prior Publication Data

US 2024/0039492 A1 Feb. 1, 2024

(30) Foreign Application Priority Data

Jul. 28, 2022 (JP) ................................ 2022-120327

(51) Int. Cl.
*H03F 3/45* (2006.01)

(52) U.S. Cl.
CPC ..... *H03F 3/45071* (2013.01); *H03F 3/45197* (2013.01)

(58) Field of Classification Search
CPC ............ H03F 3/45071; H03F 3/45183; H03F 3/45197; H03F 2203/45082; H03F 2203/45138; H03F 2203/45418; H03F 2203/45424; H03F 2203/45528; H03F 3/45475; H03F 3/45179; H03F 3/45479; H03F 1/0211; H03F 2200/168; H03F 2200/267; H04L 25/03878
USPC .......................................................... 330/253
See application file for complete search history.

(56) References Cited

U.S. PATENT DOCUMENTS

| | | | | |
|---|---|---|---|---|
| 9,496,963 | B2 | 11/2016 | Parikh | |
| 12,381,527 | B2 * | 8/2025 | Fazli Yeknami .... | H03F 3/45179 |
| 2015/0349734 | A1 * | 12/2015 | Lee .................... | H03F 3/45659 330/260 |

FOREIGN PATENT DOCUMENTS

| | | | |
|---|---|---|---|
| JP | 2016158238 | A | 9/2016 |

* cited by examiner

*Primary Examiner* — Jessica Han
*Assistant Examiner* — Khiem D Nguyen
(74) *Attorney, Agent, or Firm* — SCULLY, SCOTT, MURPHY & PRESSER, P.C.

(57) ABSTRACT

A differential amplifier includes a first differential amplifier circuit as a first stage, a second differential amplifier circuit having a common mode feedback circuit in a second stage, and a feedback differential circuit configured to multiply a differential signal between a differential output of the first differential amplifier circuit and a differential input of the second differential amplifier circuit by a magnitude of a differential output of the common mode feedback circuit.

6 Claims, 18 Drawing Sheets

$$g_m = \sqrt{2\mu C \frac{W}{L} I_{tail}} \quad \cdots (5) \qquad \pm\sqrt{\frac{2I_{tail}}{\mu C \frac{W}{L}}} \quad \cdots (2) \qquad z_2 = \frac{1}{R_b C_b} \quad \cdots (6)$$

$$\pm\sqrt{\frac{2I_{tail}}{\mu C\frac{W}{L}}} \quad \cdots(2)$$

$$v_{gs} = \sqrt{\frac{I_{tail}}{\mu C\frac{W}{L}}} + V_{th} \quad \cdots(3)$$

$$Gain_{com} \cong \frac{\frac{r_d(MP1\ or\ MP2)}{2}}{r_d(MN3)} \quad \cdots(4)$$

$r_d$(MP1,MP2): Resistance of MP1 and MP2 to Drain
$r_d$(MN3): Resistance of MP3 to Drain $$R_b C_b = \frac{\alpha R'_b C'_b}{\alpha + 1} \quad \cdots (7)$$

$$z_2 = \frac{1}{\left(\frac{\alpha R'_b}{\alpha + 1} + R_c\right) C'_b} \quad \cdots (8)$$

DIFFERENTIAL AMPLIFIER CIRCUIT

CROSS-REFERENCE TO RELATED APPLICATION

The subject application claims priority under 35 U.S.C. § 119 to Japanese Patent Application No. 2022-120327 filed on Jul. 28, 2022. The entire disclosure of Japanese Patent Application No. 2022-120327, including the specification, drawings and abstract, is incorporated herein by reference in its entirety.

BACKGROUND

The present disclosure relates to a differential amplifier circuit, and more particularly, to a technique effective for a reception circuit for a high-speed interface.

In recent years, the speed of communication devices and information processing devices has been increased, and high-speed electric signals of a serial transmission type having a transmission rate of several 10 Gbps (Giga bit per second have been mounted on a printed circuit board. When a high-speed electric signal passes through a transmission line on a printed circuit board, a high-frequency component of the high-speed electric signal is distorted due to affects of transmission line loss, random noise, and the like, and thus the eye diagram (Eye Diagram) property deteriorates. It should be noted that Eye Diagram property is a typical index for evaluating the transmission property, and is obtained by sampling and superimposing the signal for a certain period of time (horizontal axis: time, vertical axis: amplitude). The measurer can determine that the higher the central Eye is open, the lower the deterioration due to jitter and the higher the quality of transmission. Eye Diagram property may also be referred to as an eye pattern.

Among the causes of this signal-degradation, a factor such as a transmission line loss can be dealt with by mounting a correcting circuit in an inner circuit of a transmission/reception IC (Integrated Circuit).

Until now, when the upper limit of the transmission rate is several Gbps, IC of the transmission is equipped with a Emphasis circuit as a correcting circuit, and a differential amplifier circuit having a function of a CTLE (Continuous Time Linear Equalizer (continuous-time linear equalizer) having one zero point on the reception IC is implemented one step, whereby Eye Diagram performance can be improved.

However, in order to correct a transmission line which is lost at a high frequency of several 10 Gbps or more, a plurality of differential amplifier circuits having a CTLE function are required, but power dissipation increases corresponding to the number of CTLE. In addition, since the frequency response of CTLE is slow, the use of a plurality of differential amplifiers having a CTLE function results in excessive corrections at low frequencies.

Therefore, in order to cope with the next-generation high-speed communication rate, a differential amplifier having a function of a CTLE having two zeros having a high peak gain and a steep frequency-characteristic is essential.

For example, Patent Literature 1 discloses a current mode driver incorporating a continuous time linear equalizer in order to improve connection speed and signal quality between components used in the current mode driver when the communication speed becomes higher in the current mode driver. It is also disclosed to provide a plurality of zero points of the filter circuit of the continuous-time linear equalizer.

There are disclosed techniques listed below.

[Patent Document 1] Japanese Unexamined Patent Application Publication No. 2016-158238

SUMMARY

In spite of the above-described contrivance of the operation, the technique of CTLE having two zeros has a problem that the possibility of common-mode oscillations occurring is high.

The present disclosure has been made in view of the above. An object of the present application is to provide a differential amplifier including a CTLE function capable of stably compensating for loss of a transmission line in a wide band including a high frequency with a transmission rate of several 10 Gbps or more without increasing power consumption. Other objects and novel features will become apparent from the description of this specification and the accompanying drawings.

Various embodiments disclosed in the present application will be briefly described as follows. A differential amplifier circuit having a CTLE function having two typical zeros, a first differential amplifier circuit having a first differential amplifier circuit in the first stage, a second differential amplifier circuit having a common mode feedback circuit in the second stage, and a feedback differential circuit for multiplying the differential signal between the differential output of the first differential amplifier circuit and the differential input of the second differential amplifier circuit according to the magnitude of the differential output of the common mode feedback circuit, the differential input of the feedback differential circuit, the feedback circuit, the differential output of the common mode feedback circuit, a feedback path for inputting through the filter circuit formed between the ground is provided, the common mode feedback circuit divides the differential output of the second differential amplifier circuit, the voltage dividing resistor for extracting the common mode signal, the voltage dividing resistor also functions as a resistor constituting the filter circuit.

According to an embodiment, it is possible to provide a differential amplifier having a function of a CTLE having two zeros capable of stably compensating for a loss of a transmission line in a wide band including a high frequency with a transmission rate of several 10 Gbps or more without increasing power consumption.

BRIEF DESCRIPTION OF THE DRAWINGS

FIG. 2 (B) is a diagram illustrating a principle in a case where the waveform equivalent for correcting the waveform distortion at the reception end is insufficient, and an example of an eye pattern in that case.

FIG. 2 (C) is a diagram illustrating a principle in a case where the waveform equivalent for correcting the waveform distortion at the reception end is excessive and an example of an eye pattern in that case.

DETAILED DESCRIPTION

Figure 1A:
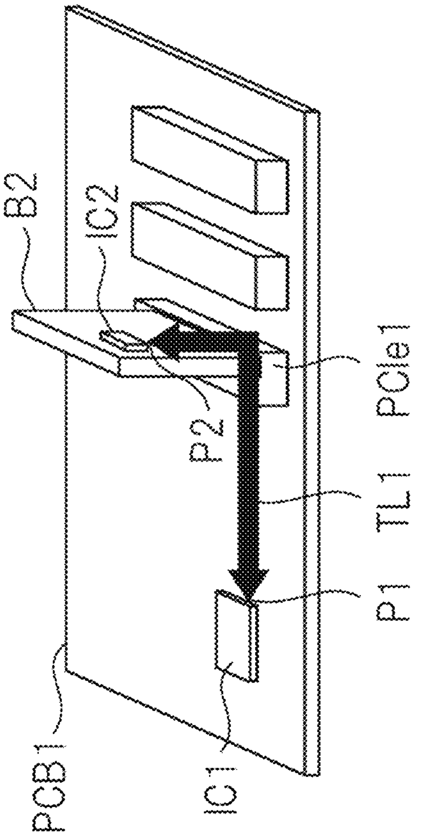
FIG. 1(A) is a perspective views illustrating an exemplary embodiment of a PCI (Peripheral Component Interconnect)-Express.

In the following embodiments, when necessary for convenience, it will be described by dividing into a plurality of sections or embodiments, unless otherwise specified, they are not related to each other, and one has a relationship of some or all of the other modification, details, supplementary description, and the like. In addition, in the following embodiments, when referring to the number of elements (including the number, numerical value, amount, range, and the like), the number is not limited to a specific number, and may be a specific number or more or less, unless otherwise specified or in principle clearly limited to a specific number.

Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In addition, the circuit elements constituting the functional blocks of the embodiments are not particularly limited, but are formed on a semiconductor-substrate such as single-crystal silicon by an integrated circuit technique such as a known CMOS (complementary MOS transistor).

Hereinafter, embodiments of the present disclosure will be described in detail with reference to the drawings. In all the drawings for describing the embodiments, the same members are denoted by the same reference numerals in principle, and repetitive description thereof will be omitted. Furthermore, the dimensional ratios in the drawings are exaggerated for convenience of explanation and may differ from the actual ratios.

FIG. 1(A) is a perspective view schematically showing a logic circuit module IC1 mounted on a PCB board and a logic circuit module IC2 mounted on an expansion card B2 in a PCB board PCB1 having an expansion slot PCIe1 which is a PCI (Peripheral Component Interconnect)-Express expansion slot. Note that PCI-Express is a connecting standard of an extended interface of a serial transmission system, and may be referred to as a PCIe.

There is a transmission line TL1 in which high-speed electric signals are transmitted between the logic circuit module IC1 and the logic circuit module IC2. The logic circuit module IC1 and the logic circuit module IC2 are connected to each other in a bidirectional manner. In the present embodiment, the electric signal output from the point P1, which is one of the output terminals of the logic circuit module IC1, is received at the point P2, which is one of the input terminals of the logic circuit module IC2.

Figure 1B:
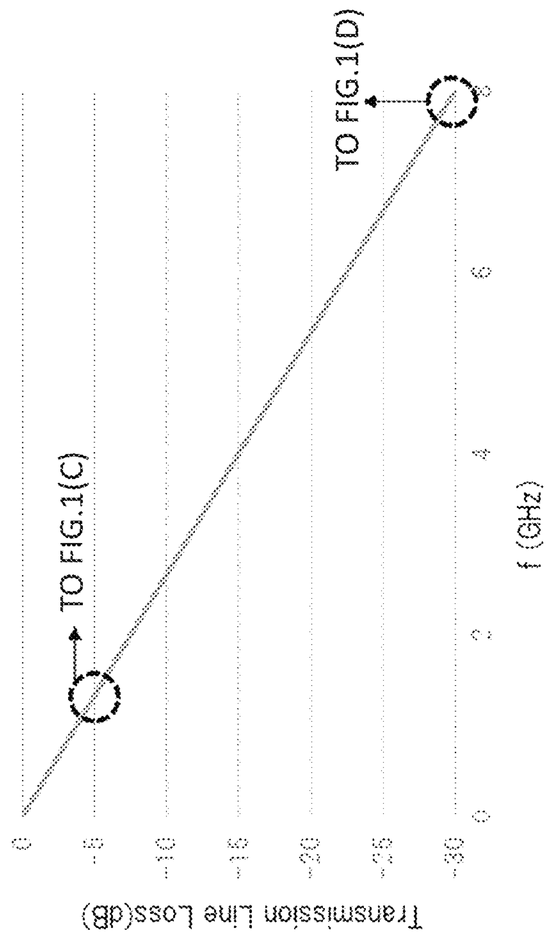
FIG. 1(B) is a graph showing an example of a loss frequency characteristic of the transmission line of the implementation form of FIG. 1(A).

FIG. 1(B) is a graph illustrating an exemplary transmission line loss with respect to the frequency of the transmission line TL1. Although the transmission line loss is displayed in units of decibels, it can be seen that the transmission line loss of the transmission line TL1 increases as the frequency increases.

Figure 1C:
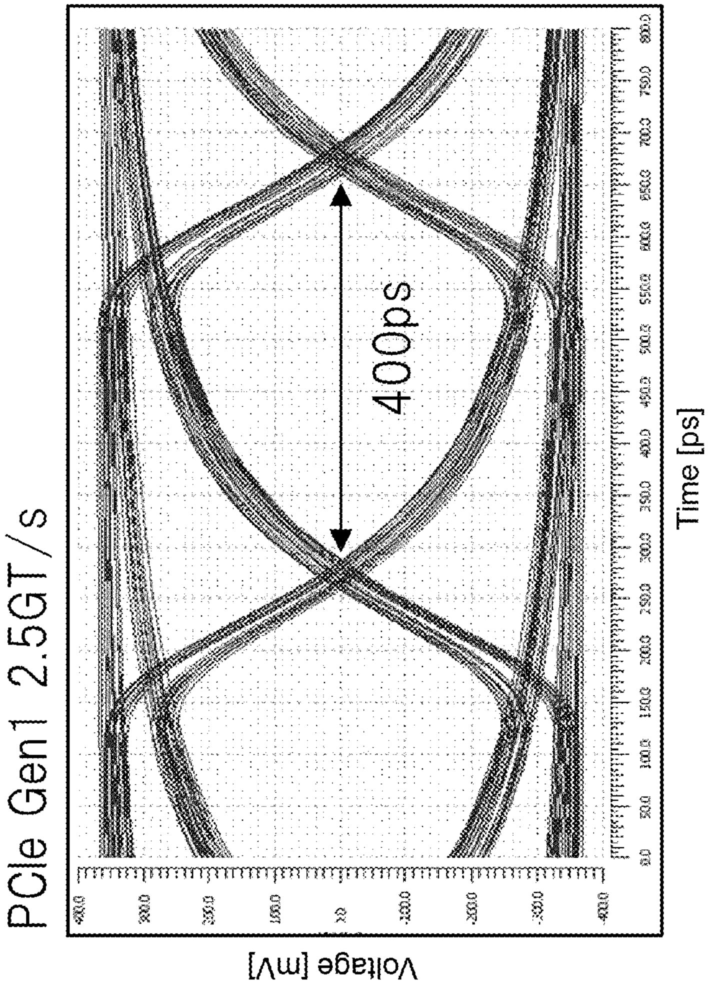
FIG. 1(C) is a measurement diagram illustrating an example of the eye pattern of the receiving end in the low frequency region of FIG. 1 (B).

FIG. 1(C) shows an eye pattern of an electric signal using a first-generation (Gen1) of PCIe in a pointed P2 that is a receiving end of a transmission line TL1. Since the central eye is 400 ps open, it can be seen that for 2.5 GT/S (Transfer per second) there is less deterioration due to jitter and high-quality transmission.

Figure 1D:
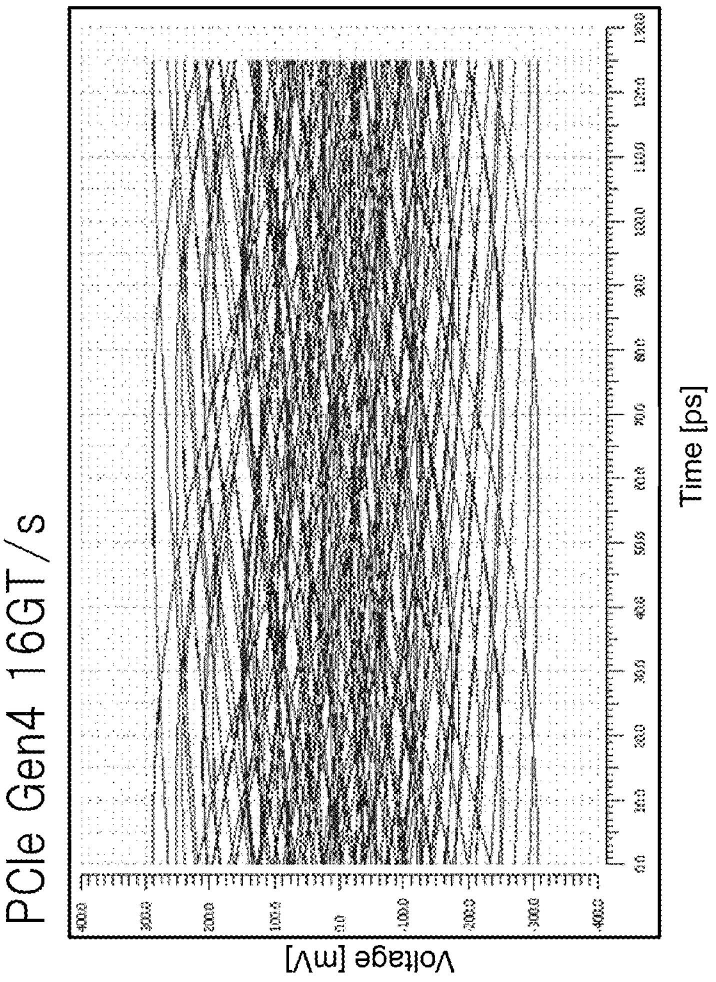
FIG. 1(D) is a measurement diagram showing an example of the eye pattern of the receiving end in the high-frequency region of FIG. 1 (B).

FIG. 1(D) shows an eye pattern of an electric signal using a fourth-generation (Gen4) of PCIe in a pointed P2 that is a receiving end of a transmission line TL1. Since the central eye is not open, it can be seen that the transmission rate of 16 GT/S is significantly degraded by jitter, is of low quality, and cannot be decrypted.

Figures 2A, 2B, 2C:
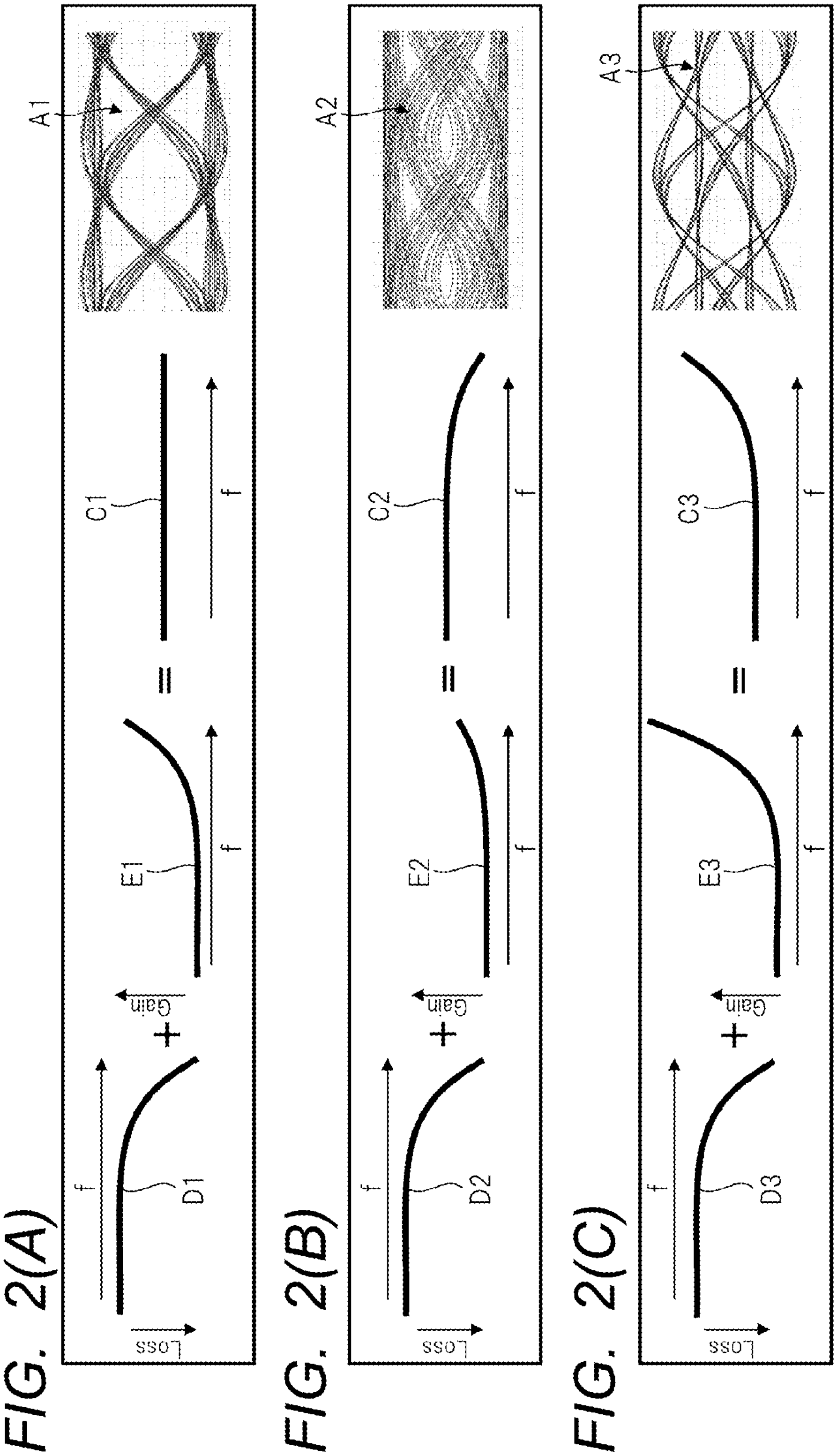
FIG. 2(A) is a diagram illustrating an example of a principle in which waveform equivalence for correcting waveform distortion at a receiving end is appropriately performed and an eye pattern in that case.

FIG. 2(A) to FIG. 2(C) are schematic diagrams showing examples of frequency characteristics and eye patterns after correction when an example of frequency characteristics of a transmission line and an example of frequency characteristics of an equalizer such as a CTLE are combined.

FIG. 2(A) is a schematic diagram illustrating an example of a case where correction of a frequency characteristic by an equalizer is appropriately performed. The transmission line frequency-response D1 of FIG. 2(A) is lossy in the high-frequency range. In addition, in the gain-frequency response E1 of the equalizer of FIG. 2(A), the gain is increased in the high-frequency range corresponding to the loss of the transmission line. Therefore, the correction frequency-response C1 is near flat, and a large opening is formed in the center of the eye pattern A1, allowing the transmitted electric signal to be transmitted appropriately.

FIG. 2(B) is a schematic diagram illustrating an example of a case where correction of a frequency characteristic by an equalizer is insufficient. The transmission line frequency characteristic D2 of FIG. 2(B) is lossy in the high frequency range as in the transmission line frequency characteristic D1. In addition, in the gain-frequency response E2 of the equalizer of FIG. 2(B), the gain corresponding to the loss of the transmission line is insufficient in the high-frequency range. As a consequence, the frequency-response C2 after correction is a property of loss occurring in the high frequency range, and only a small opening occurs in the central portion of the eye pattern A2, thus making it difficult to sufficiently ensure margins for proper transmission of information of electric signals transmitted by the effect of jitter.

FIG. 2(C) is a schematic diagram illustrating an example of a case where correction of a frequency characteristic by an equalizer becomes excessive. The transmission line frequency characteristic D3 of FIG. 2(C) has a large loss in the high frequency range as in the transmission line frequency characteristic D1. In the gain frequency response E3 of the equalizer of FIG. 2(C), the gain corresponding to the loss of the transmission line is excessive in the high frequency range. As a consequence, the frequency-response C3 after correcting becomes a property in which the gain occurs in the high frequency range, and since the opening of the central portion of the eye pattern A3 does not open cleanly, it becomes difficult to sufficiently secure the margin for appropriately transmitting the information of the electric signal transmitted by the effect of jitter.

As can be seen from FIG. 2(A), FIG. 2(B), and FIG. 2(C) described above, even if the correction amount due to the gain frequency characteristic of the equalizer is insufficient, or even if the correction amount becomes excessive, the opening in the central portion of the eye pattern is not appropriately opened, so that the waveform distortion cannot be appropriately corrected.

Figure 3B:
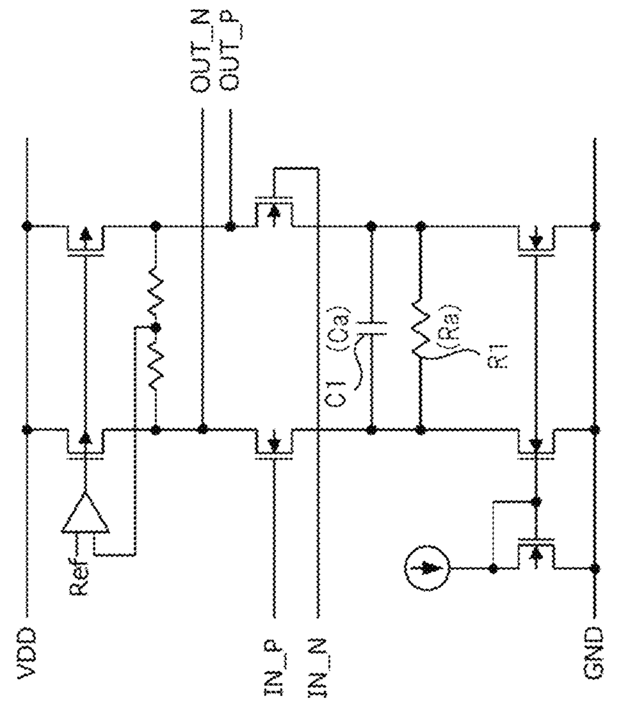
FIG. 3(B) is a circuit diagram showing an example of a specific example of the receiving circuit of FIG. 3 (A).
Figure 3A:
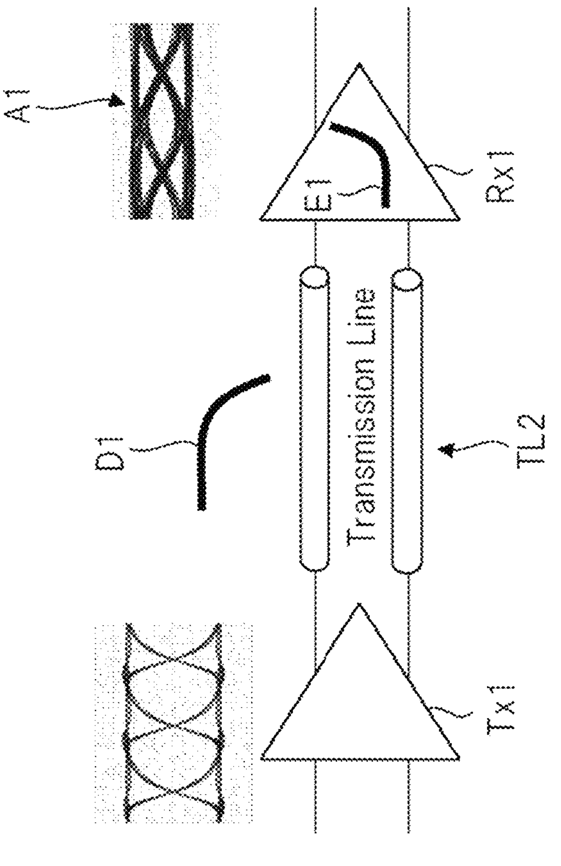
FIG. 3(A) is a diagram illustrating a state in which waveform equivalence is appropriately performed in a circuit in which the implementation of FIG. 1(A) is simplified.

FIG. 3(A) is a diagram schematically illustrating a transmission line TL2 having a transmission line frequency characteristic D1 of FIG. 2(A), a receiver Rx1 including an equalizer having a gain frequency characteristic E1 of FIG. 2(A), and a transmitter Tx1 as an implementation form can be seen.

FIG. 3(B) is a circuit diagram of a differential amplifier circuit having a function of a CTLE having one zero point, which is shown as an exemplary equalizer having a gain-frequency response E1. The differential signal from the differential output of Tx1 of FIG. 3(A) via the transmission line TL2 is inputted to the differential amplifier as IN_P and IN_N. A zero point is calculated by the capacitor C1 (capacitance value Ca) and the resistor R1 (resistance value Ra), and frequency-correction is performed. The frequency-corrected differential output is output from OUT_N and OUT_P, and the eye pattern A1 of FIG. 3(A) is formed.

Figure 4A:
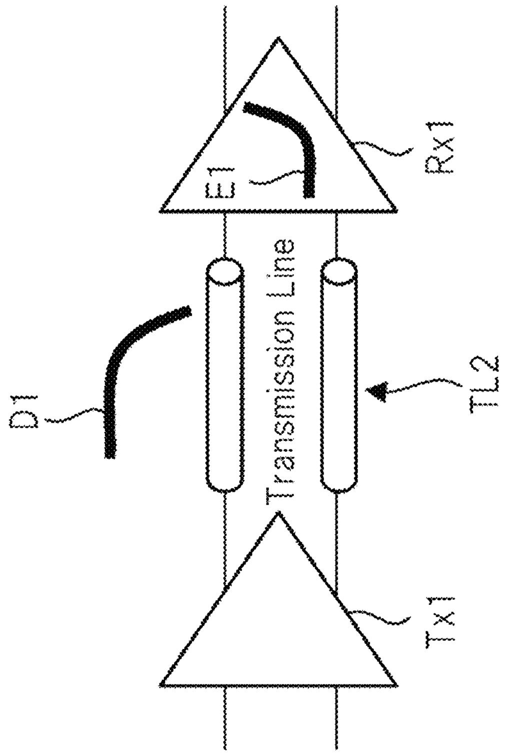
FIG. 4(A) is a schematic diagram of a case where the electric signal flowing through the transmission line moves to the high frequency band in the diagram of FIG. 3 (A), the appearance configuration is the same as that of FIG. 3 (A).

FIG. 4(A) is a reference diagram in the circuit configuration of FIG. 3(A), in which the electric signal has a high frequency in the vicinity of 10 gigahertz, and the appearance configuration is the same as that of FIG. 3(A), and thus description thereof will be omitted.

Figure 4B:
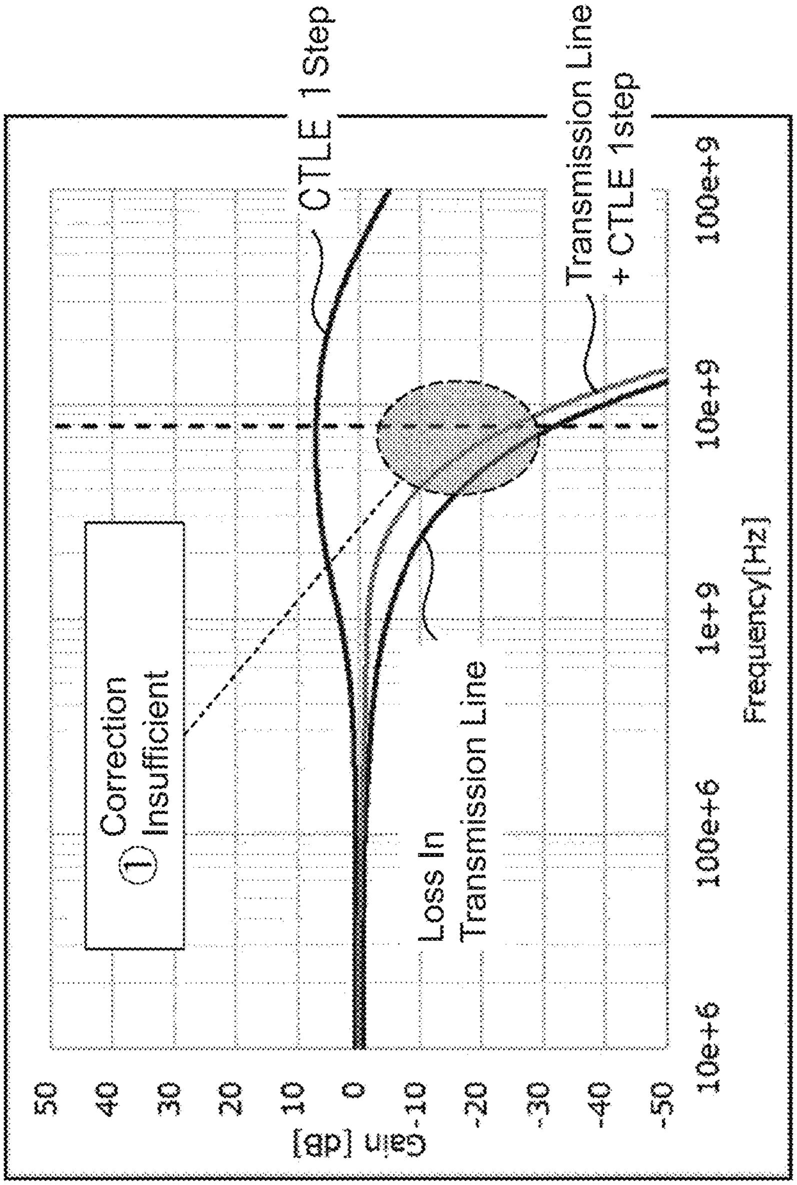
FIG. 4(B) is a graph showing that in the configuration of FIG. 4 (A), only the frequency-characteristic of CTLE having one zero point of Rx1 is insufficient waveform-equivalent in the high-frequency band.

FIG. 4(B) is a graph showing a gain frequency characteristic of the circuit configuration of FIG. 3(A) in which the electric signal is increased to a high frequency up to around 10 gigahertz.

The loss of the transmission line is greatly increased in the vicinity of 10 gigahertz, but when CTLE having one zero point is one stage, a gain that compensates for the loss in the vicinity of 10 gigahertz cannot be obtained. Therefore, as described in FIG. 2(B), the eye pattern of the electric signal in the vicinity of 10 gigahertz does not have an appropriate waveform.

Figure 4C:
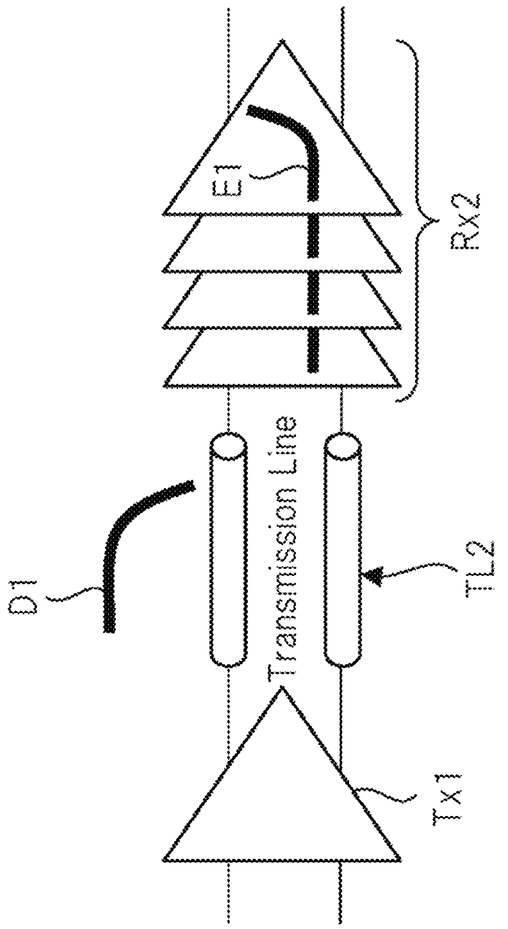
FIG. 4(C) is a schematic diagram illustrating an exemplary configuration in which reception circuitry having a function of a CTLE having one zero point is connected in four stages in series in the configuration FIG. 4(A).

FIG. 4(C) is a diagram schematically illustrating a circuit configuration in which a plurality of CTLE having one zero point (in FIG. 4(C), a CTLE is connected in series in four stages in FIG. 4(C)) are connected in order to compensate for the loss of a transmission line in the vicinity of 10 gigahertz described in FIG. 4(B). According to this circuit configuration, it is possible to compensate for the loss of the transmission line in the vicinity of 10 gigahertz.

Figure 4D:
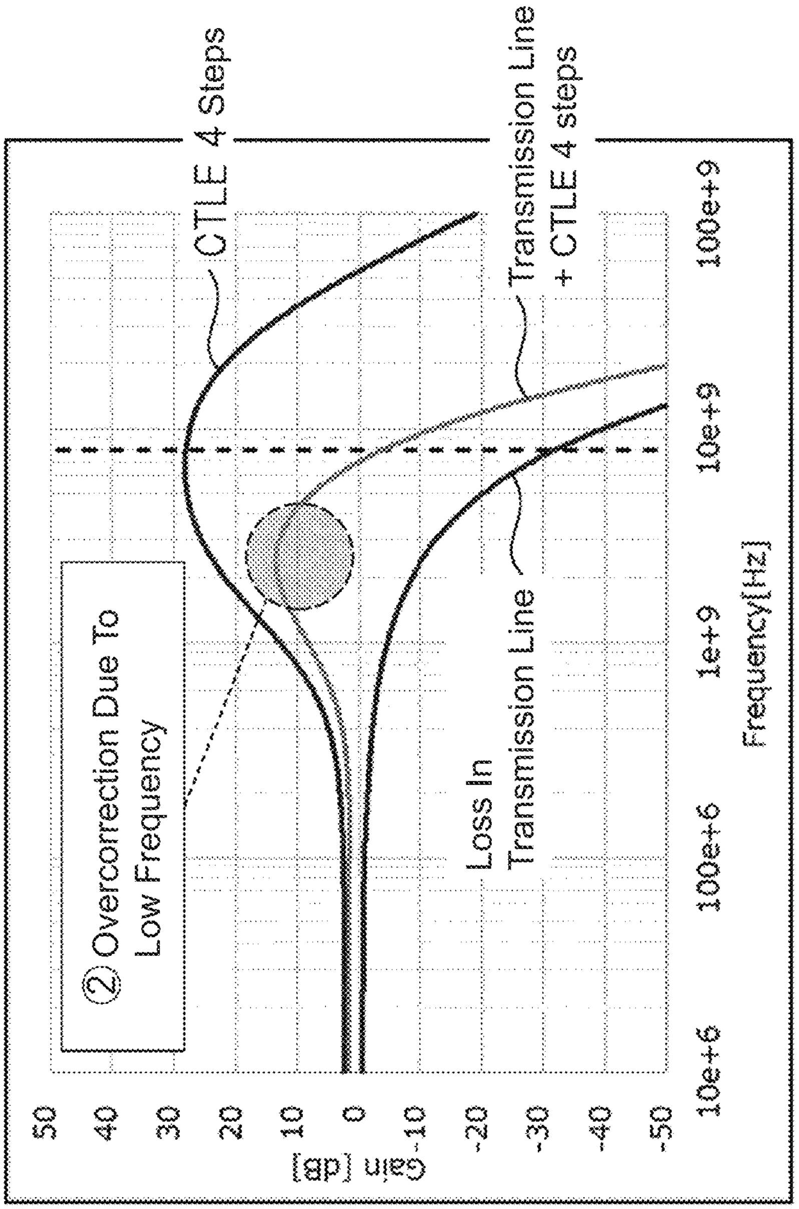
FIG. 4(D) is a graph showing that the waveform equivalent becomes excessive in the low frequency band in the configuration of FIG. 4(C).

FIG. 4(D) is a graph showing a gain frequency characteristic of the circuit configuration of FIG. 4(C), in which the electric signal is increased to a high frequency up to around 10 gigahertz. The gain in the vicinity of 10 gigahertz of the compensated frequency characteristic obtained by adding the frequency characteristic of the four-stage CTLE to the frequency characteristic of the transmission line is in the vicinity of 0 decibels, and the appropriate gain can be secured. However, CTLE having a single zero point has a gradually convex frequency characteristic. Therefore, in a low frequency band in which the frequency is in the vicinity of several gigahertz, the gain becomes large and the correction becomes excessive. That is, as described in FIG. 2(C), the eye pattern of the electric signal in the vicinity of several gigahertz does not have an appropriate waveform.

In addition, the use of four stages of CTLE increases power dissipation.

Figure 5A:
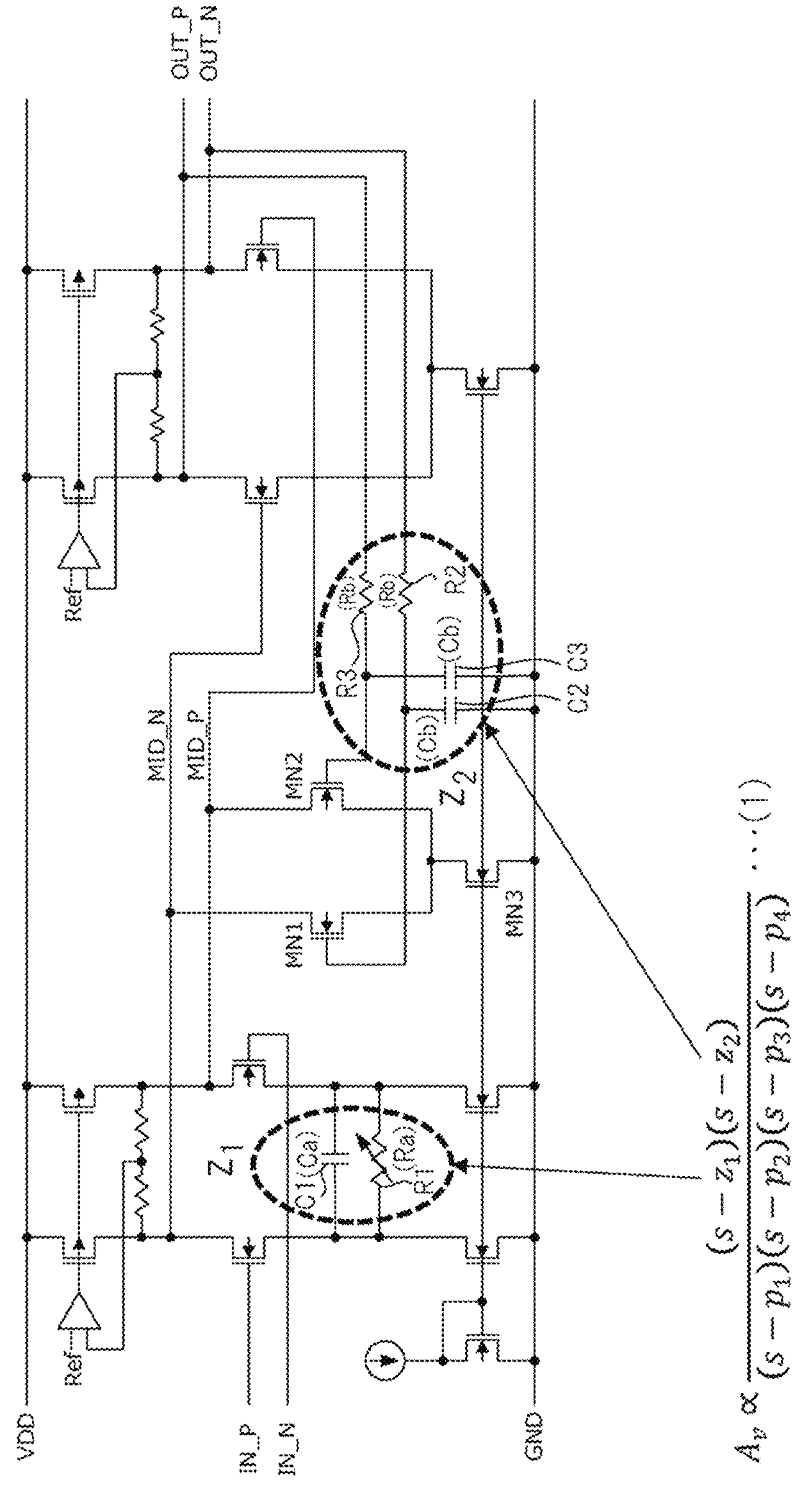
FIG. 5(A) is a circuit diagram illustrating an exemplary differential amplifier circuit having the function of a CTLE having two zeros.

FIG. 5(A) is a diagram illustrating an exemplary configuration of a differential amplifier circuit having a function of a CTLE having two zeros for improving the problem that the gain is excessively correction in a low-frequency band near several gigahertz and the power dissipation is increased in the circuit configuration of FIG. 4(C). Since a CTLE having two zeros is easy to obtain a steep and high gain, it can appropriately compensate for transmission line loss of electric signals of several tens of gigahertz (next generation communication rate) and not increase power consumption. Equation (1) shows the transfer function of the circuitry of CTLE with two zeros shown in FIG. 5(A). One zero point is computed by the capacitor C1 and the resistor R1 as described above. The other zero point is computed by the capacitor C2, C3 in the feedback path of the differential outputs OUT_P and OUT_N and the resistor R2, R3. The capacitance value of the capacitor C2 and the capacitance value of the capacitor C3 are preferably the same capacitance value Cb. The resistance value of the resistor R2 and the resistance value of the resistor R3 are preferably the same resistance value Rb. Furthermore, it is preferable that the capacitance value Cb of the capacitor C1 differs from the capacitance value Cb of the capacitors C2 and C3. Furthermore, it is preferable that the resistance value Ra of the resistance R1 differs from the resistance values Rb of the resistors R2 and R3.

Figure 5B:
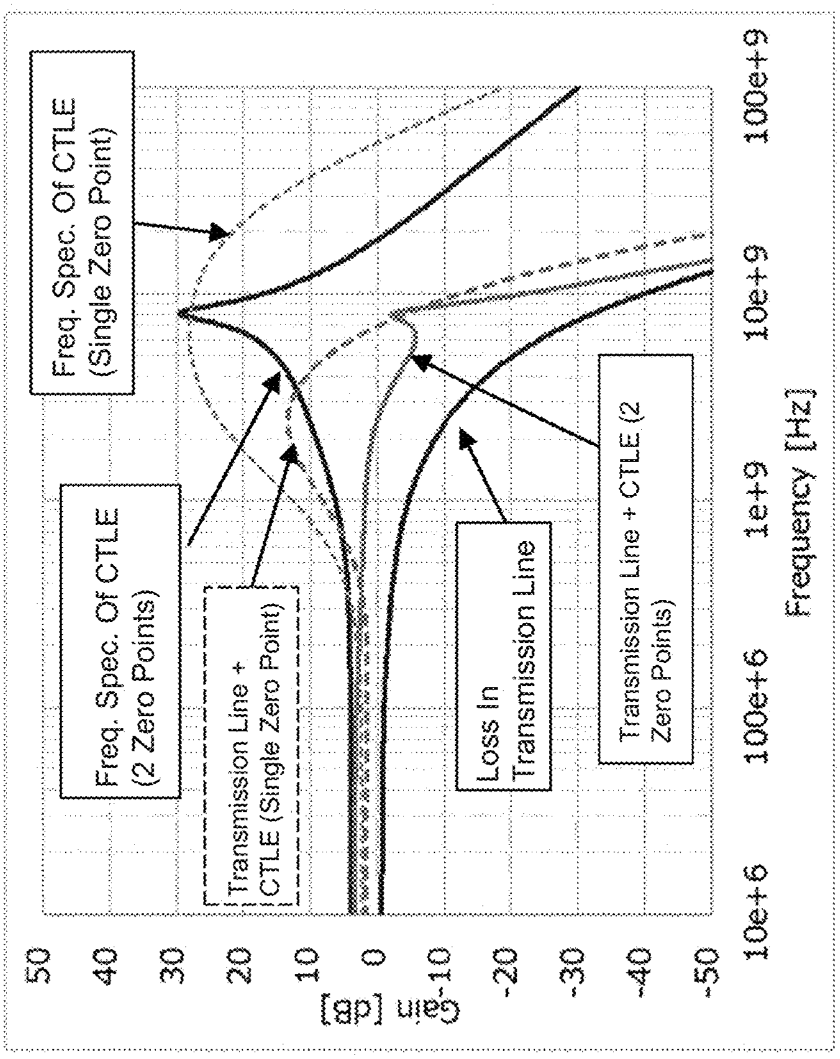
FIG. 5(B) is a diagram comparing the frequency characteristics of the differential amplifier circuit having the function of CTLE having two zero points of the diagram 5A, the transmission line, and the combination thereof, and the frequency characteristics of the differential amplifier circuit having the function of CTLE having one zero point shown in FIG. 4 (C), the transmission line, and the combination thereof.

FIG. 5(B) is a diagram shows the frequency characteristics of CTLE having two zeros of the diagram of FIG. 5(A), the frequency characteristics of the loss of the transmission line, the frequency characteristics of CTLE having two zeros of FIG. 5(A) and the frequency characteristics of the loss of the transmission line added. Further, for comparative purposes, FIG. 5(B) shows a frequency characteristic obtained by connecting a CTLE having one zero point of the FIG. 3(B) in four stages in series, a frequency characteristic obtained by connecting a CTLE having one zero point of FIG. 3(B) in four stages in series, and a frequency characteristic obtained by adding a frequency characteristic of a loss of a transmission line. The frequency characteristics obtained by adding the frequency characteristics of CTLE having two zeros and the frequency characteristics of the loss of the transmission line, the gain is not excessively in the low frequency domain, it has been shown that the electric signal of the target high frequency can be appropriately corrected. However, a CTLE having two zeros in FIG. 5(A) has a problem that common-mode oscillations are likely to occur. Next, a problem that common-mode oscillation is likely to occur will be described with reference to FIG. 6.

Figure 6:
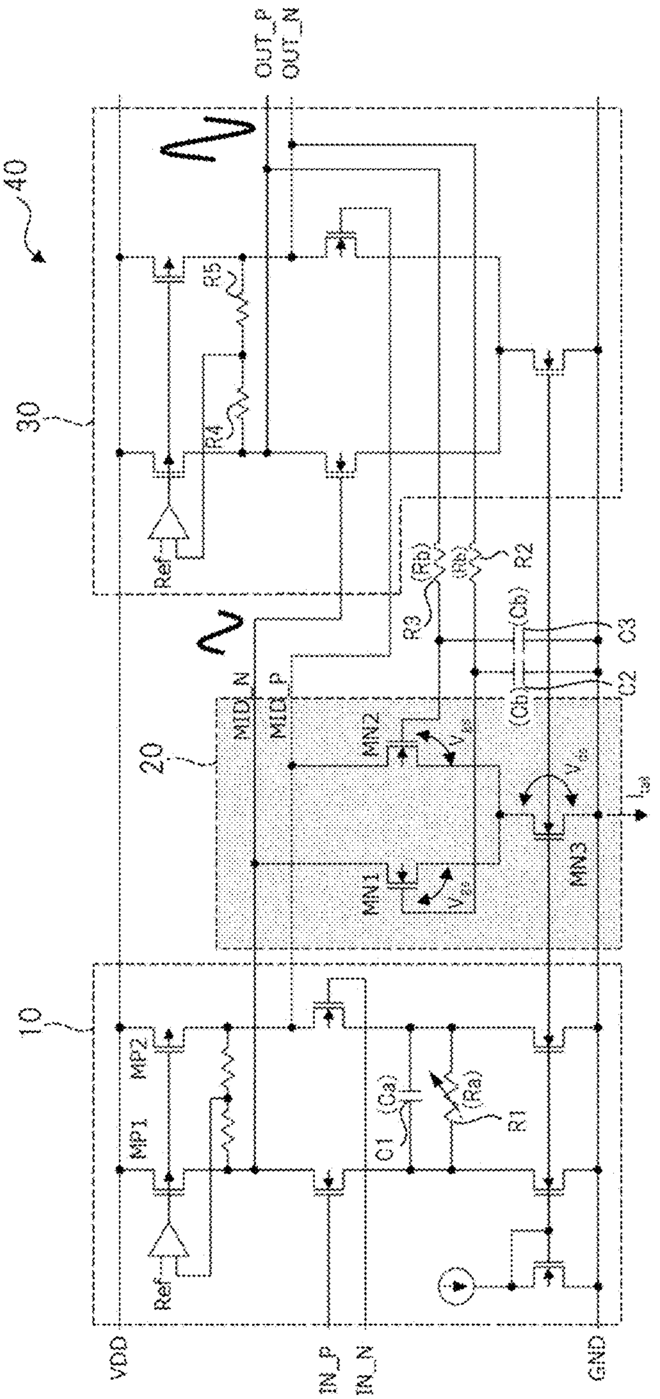
FIG. 6 is a circuit diagram for explaining the principles of common-mode oscillation occurring in a differential amplifier circuit having the function of a CTLE having two zeros in FIG. 5(A).

FIG. 6 is a diagram for explaining the in-phase oscillation of CTLE having two zeros shown in the diagram 5A, and the circuit configuration is the same as CTLE of the diagram 5A. The differential amplifier circuit 40 having the function of CTLE of FIG. 6 includes a feedback path including a first differential amplifier circuit 10, a feedback differential circuit 20, a second differential amplifier circuit 30, a resistor R2, R3, and a capacitor C2, C3.

A differential signal (MID_P-MID_N) output from the first differential amplifier circuit 10 is amplified, and a differential signal (OUT_P-OUT_N) is output from the differential amplifier circuit 40. Since the amplified signal OUT_P and the signal OUT_N are fed back to the feedback differential circuit 20 including the transistor MN1, the transistor MN2, and the transistor MN3, the input dynamic range of the feedback differential circuit 20 needs to be large.

The input dynamic range of the feedback differential circuit 20 is represented by Equation (2) in FIG. 6. As shown in Equation (2), in order to increase the input dynamic range, Itail needs to be increased, and the channel width W (transistor MN1) and the channel width W (transistor MN2) need to be decreased. However, when Equation (2) is large, Vgs of the transistor MN1 and the transistor MN2 represented by Equation (3) increases. It can be seen that as Vgs of the feedback differential 20 of FIG. 6 increases, Vds of the transistor MN3 decreases. Therefore, since the operating region of the transistor MN3 changes from the saturated region to the non-saturated region, the resistivity rd (MN3) of the transistor MN3 as viewed from the drain-side is greatly reduced. As a consequence, there is a problem that the in-phase gain of the differential amplifier circuit 40 represented by Equation (4) is increased, and the possibility that the differential amplifier circuit 40 having the function of a CTLE having two zero points will generate the in-phase oscillation is very high.

Figure 7:
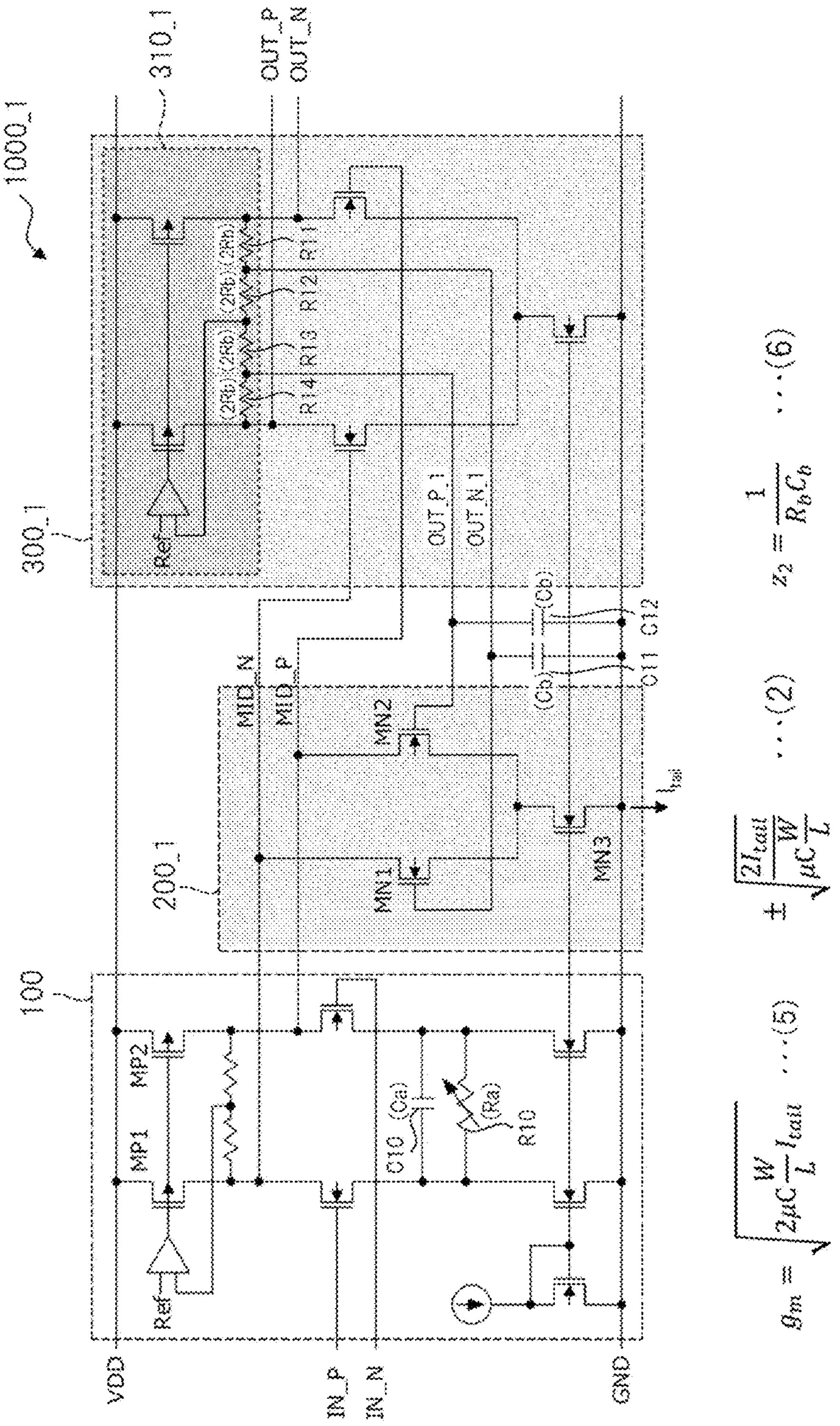
FIG. 7 is an exemplary circuit diagram of a differential amplifier circuit having a function of a CTLE having two zeros according to Embodiment 1.

FIG. 7 is a circuit diagram showing a circuit configuration of a differential amplifier circuit 1000_1 having the function of a CTLE having two zeros according to Embodiment 1. The differential amplifier circuit 1000_1 of FIG. 7 includes a first differential amplifier circuit 100, a feedback differential circuit 200_1, a second differential amplifier circuit 300_1, and a feedback path including a resistor R11 to R14 and a capacitor C11, C12. The second differential amplifier circuit 300 1 includes a common mode feedback circuit 310 1. Common mode feedback circuit 310_1, without giving effect to the second zero point, reduces the magnitude of the return signal to the feedback differential circuit 200_1, including the transistor MN1, the transistor MN2, and the transistor MN3. Specifically, the amplitude level of the feedback signal is halved without changing the voltage at the bias point of the common mode feedback circuit 310_1. The voltage at the bias point should be ((OUT_P+OUT_N)/2), but by connecting the resistor R11 to R14 in series and drawing the voltage at the bias point from the midpoint of the resistor R11 to R14, the voltage at the bias point becomes ((OUT_P+OUT_N)/2). Further, the feedback signal OUT_P_1 becomes half of the output signal OUT_P, the feedback signal OUT_N_1 becomes half of the output signal OUT_N, the problem of increasing the dynamic range of the feedback differential circuit 200_1 is eliminated, it is possible to reduce the probability of causing the common-mode oscillation. Further, the second zero point can be calculated from Equation (6). That is, instead of the resistor R2 and the resistor R3 in FIG. 6, the resistor R11 to R14 has a function of forming a second zero point. The common mode feedback circuit 310_1 includes a resistor R11 to R14 which is a voltage dividing resistor for extracting a common mode signal, and the resistor R11 to R14 functions as a resistor component of RC filter forming the second zero point.

As described above, since the feedback amount is halved, in order to maintain the gain of the feedback differential circuit 200_1, gm of Equation (5) in FIG. 7 needs to be doubled. To this end, Itail and W (transistor MN1 and MN2) need to be doubled, but as shown in Equation (2), even if Itail and W (transistor MN1 and MN2) are doubled, Itail and W (transistor MN1 and MN2) are canceled out in the dynamic range (Equation (2)) of the feedback differential circuit 200_1, so that the dynamic range of the feedback differential circuit 200_1 is not affected. Further, by setting the resistances of the resistor R11 to R14, which is a voltage dividing resistor for extracting a common mode signal from the common mode feedback circuit 310_1, to 2Rb, the effect on the second zero point (Equation (6)) is not generated with respect to CTLE of FIG. 6 in which the resistances R2 and R3 are arranged in the feedback path.

The configuration of the differential amplifier circuit 1000_1 will be described with reference to the circuit diagram as follows. The differential amplifier circuit 1000_1 having the function of a CTLE having two zero points includes a first differential amplifier circuit 100 in the first stage, and a second differential amplifier circuit 300_1 having a common mode feedback circuit 310_1 in the second stage. Further, the differential amplifier circuit 1000_1 includes a feedback differential circuit 200_1 that multiplies the differential signal (MID_N and MID_P) between the differential output of the first differential amplifier circuit 100 and the differential input of the second differential amplifier circuit 300_1 by feedback in accordance with the magnitude of the differential output (OUT_P_1 and OUT_N_1) of the common mode feedback circuit 310_1. The differential input of the feedback differential circuit 200_1 is provided with a feedback path for inputting the differential outputs (OUT_P_1 and OUT_N_1) of the common mode feedback circuit 310_1 to the ground through filtering circuits (R11 to R14 and C11, C12). The common mode feedback circuit 310_1 includes a voltage dividing resistor (R11 to R14) that divides the differential output of the second differential amplifier circuit and extracts a common mode signal (an input signal that is a pair with Ref of the operational amplifier of the common mode feedback circuit 310_1), and the voltage dividing resistor (R11 to R14) also functions as a resistor constituting the filter circuit.

Further, the configuration of the differential amplifier circuit 1000_1 will be described with reference to the circuit diagram as follows. The filter circuitry functions as a low-pass filter having capacitors (C11 and C12) formed between the filter circuitry and ground (GND). Terminals for dividing the resistance value of the voltage dividing resistor (R11 to R14) (the connection point between R12 and R13) into two is a common mode signal extraction terminal for extracting a common mode signal, and terminals for dividing the resistance value of one end of the common mode signal extraction terminal and the voltage dividing resistor (the connection point between R13 and R14 or the connection point between R11 and R12) and terminals for dividing the resistance value of the other end of the common mode signal extraction terminal and the voltage dividing resistor (the connection point between R11 and R12 or the connection point between R13 and R14) are two terminals for outputting the differential output of the common mode feedback circuit ((OUT_P_1 and OUT_N_1)).

According to the differential amplifier circuit of the first embodiment described above, since there is no need to be connected in multiple stages, without increasing the power consumption, the transmission rate in a wide band including a high frequency of several 10 Gbps or more it is possible to provide a differential amplifier circuit capable of stably compensating for the loss of the transmission line. In particular, when the transmission rate becomes a high frequency of several 10 Gbps or more, it is possible to provide a differential amplifier capable of suppressing in-phase oscillation while having a steep high gain. Further, since it is possible to reduce the amplitude of the feedback signal without affecting the common bias, it is easy to secure the input dynamic range of the feedback differential circuit. As a result, since it is not necessary to increase the input dynamic range of the feedback differential circuit, it is possible to reduce the problem of common-mode oscillation. Furthermore, it becomes possible to commonize the common mode feedback circuit as part of the feedback path.

Figure 8:
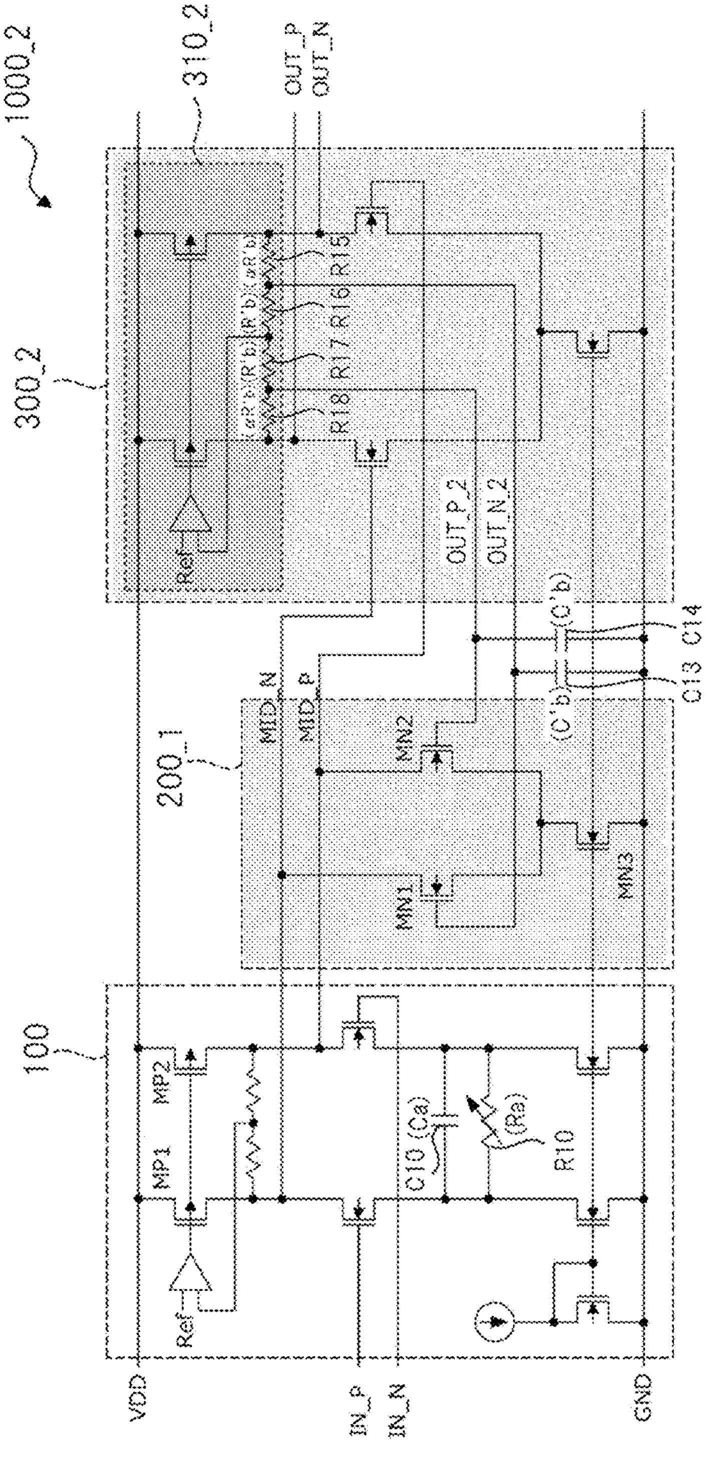
FIG. 8 is an exemplary circuit diagram of a differential amplifier circuit having a function of a CTLE having two zeros according to Embodiment 2.

FIG. 8 is a circuit diagram showing a circuit configuration of a differential amplifier circuit 1000_2 having a function of a CTLE having two zeros according to the second embodiment. The differential amplifier circuit 1000_2 having the function of CTLE of FIG. 8 includes a feedback path including a first differential amplifier circuit 100, a feedback differential circuit 200_1, a second differential amplifier circuit 300_2, a resistor R15 to R18, and a capacitor C13, C14. The second differential amplifier circuit 300_2 includes a common mode feedback circuit 310_2. The common mode feedback circuit 310_2 is a circuit in which the magnitude of the feedback signal to the feedback differential circuit 200_1 including the transistor MN1, the transistor MN2, and the transistor MN3 is reduced to $(1/(\alpha+1):\alpha$ is any positive real number) of the differential amplifier circuit 40 shown in FIG. 6. Rb and Cb shown in Equation (7) of FIG. 8 are Rb and Cb of Equation (6) of the second zero point of the differential amplifier circuit 40 shown in FIG. 6, and by determining $\alpha$, R'b, and C'b so as to satisfy the relation of Equation (7), the amplitude-level of the feedback signal can be reduced without moving the second zero point of CTLE. The voltage at the bias point is obtained by connecting the resistor R15 to R18 in series and drawing the voltage at the bias point from the midpoint of the resistor R15 to R18, so that the voltage at the bias point becomes ((OUT_P+OUT_N)/2).

A detailed configuration of the differential amplifier circuit 1000_2 will be described with reference to a circuit diagram as follows. The filter circuitry functions as a low-pass filter having capacitors (C13 and C14) formed between the filter circuitry and ground (GND). A terminal (a connection point between a R15 to R18 and a R16) for dividing a resistance value of a voltage dividing resistor (R15) into 2 is used as a common mode signal extraction terminal for extracting a common mode signal, and a 1 terminal (for example, a connection point between a R17 and a R18) between a common mode signal extraction terminal and one end of a voltage dividing resistor is provided. The ratio $(1:\alpha)$ of the resistance value to the common mode signal extraction terminal and the other end of the voltage dividing resistor is equal to the ratio $(1:\alpha)$ of the resistance value to the common mode signal extraction terminal and the resistance value to the other end of the voltage dividing resistor The first terminal and the second terminal to be set are two terminals for outputting the differential output ((OUT_P_2 and OUT_N_2)) of the common mode feedback circuit 310_2.

According to the differential amplifier circuit of the second embodiment described above, it is possible to achieve the effect of the differential amplifier circuit of the first embodiment. In addition, since the amplitude of the feedback signal can be reduced to $(1/(\alpha+1))$ without affecting the common bias, it is easy to secure the input dynamic range of the feedback differential circuit. Further, by appropriately determining the bias voltage dividing resistors $\alpha$R'b and $\alpha$C'b, R'b, and C'b, the magnitude of the feedback signal can be reduced without moving the second zero point of CTLE.

Figure 9:
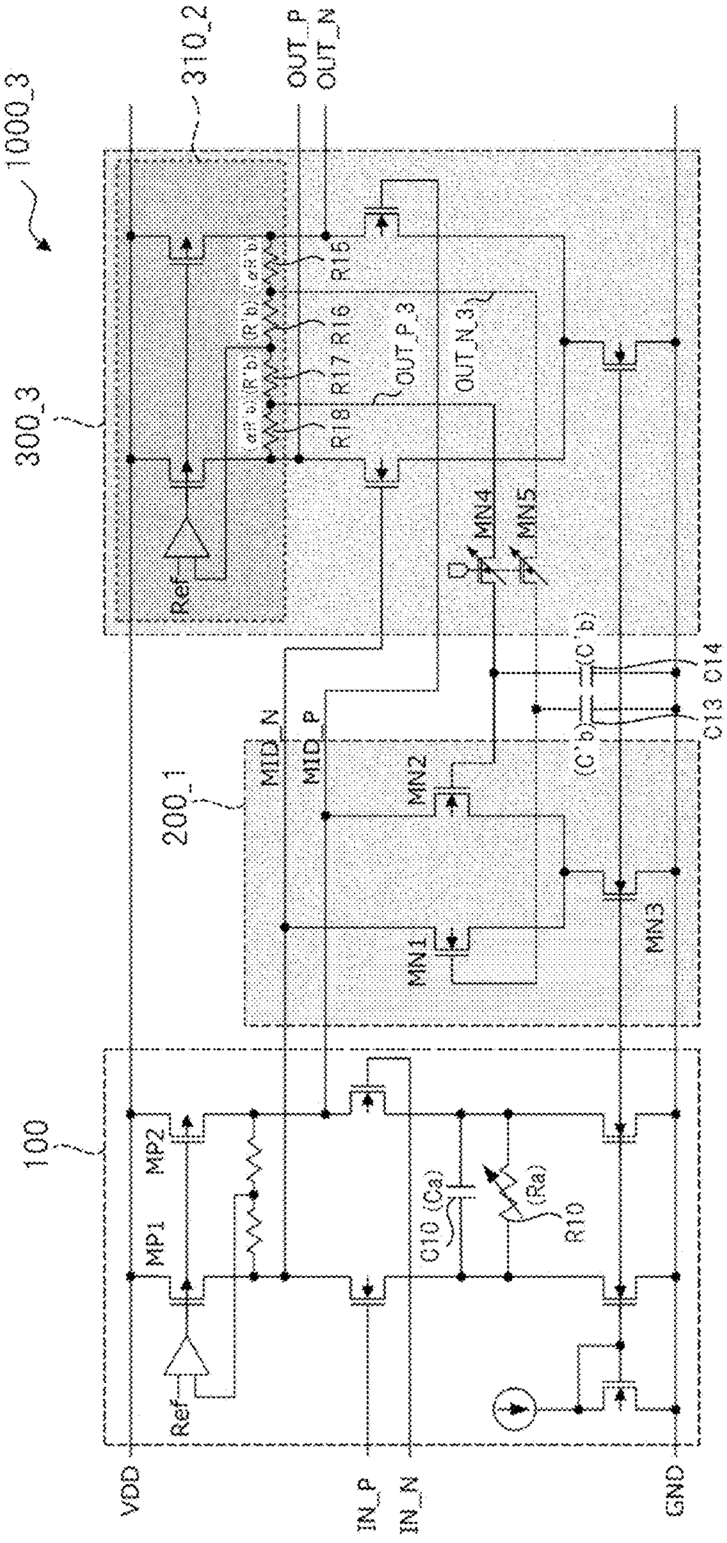
FIG. 9 is an exemplary circuit diagram of a differential amplifier circuit having a function of a CTLE having two zeros according to the third embodiment.

FIG. 9 is a circuit diagram showing a circuit configuration of a differential amplifier circuit 1000_3 having a function of a CTLE having two zeros according to the third embodiment. The differential amplifier circuit 1000_3 having the function of CTLE of FIG. 9 includes a feedback path including a first differential amplifier circuit 100, a feedback differential circuit 200_1, a second differential amplifier circuit 300_3, a resistor R15 to R18, a capacitor C13, C14, and a transistor MN4, MN5. The second differential amplifier circuit 300 3 includes a common mode feedback circuit 310 2. When it is desired to move the second zero point of the differential amplifier circuit 1000_3 having CTLE function, if the resistance R16 and the resistance R'b of R17 of the common mode feedback circuit 310_2 are changed, the output signal (OUT_P and OUT_N) of the second differential amplifier circuit 300_3 is affected. However, by adjusting the resistance value Rc of ON resistance of the transistor MN4, MN5 included in the feedback path, the input dynamic range of the feedback differential circuit 200_1 can be secured and the second zero can be moved without affecting the level of the output signals OUT_P and OUT_N. Z2 of Equation (8) indicates the value forming the second zero point, the $\alpha$R'b indicates the value of the voltage dividing resistor of the common mode feedback circuit 310_2, and C'b indicates the value of the capacitor C13, C14 of the feedback path.

According to the differential amplifier circuit of the third embodiment described above, it is possible to achieve the effect of the differential amplifier circuit of the first embodiment. Further, similarly to the differential amplifier circuit according to the second embodiment, since it is possible to reduce the amplitude of the feedback signal to $(1/(\alpha+1))$ without affecting the common bias, it is easy to secure the input dynamic range of the feedback differential circuit.

Furthermore, it is possible to move the second zero without changing the level of the output signal.

Figure 10:
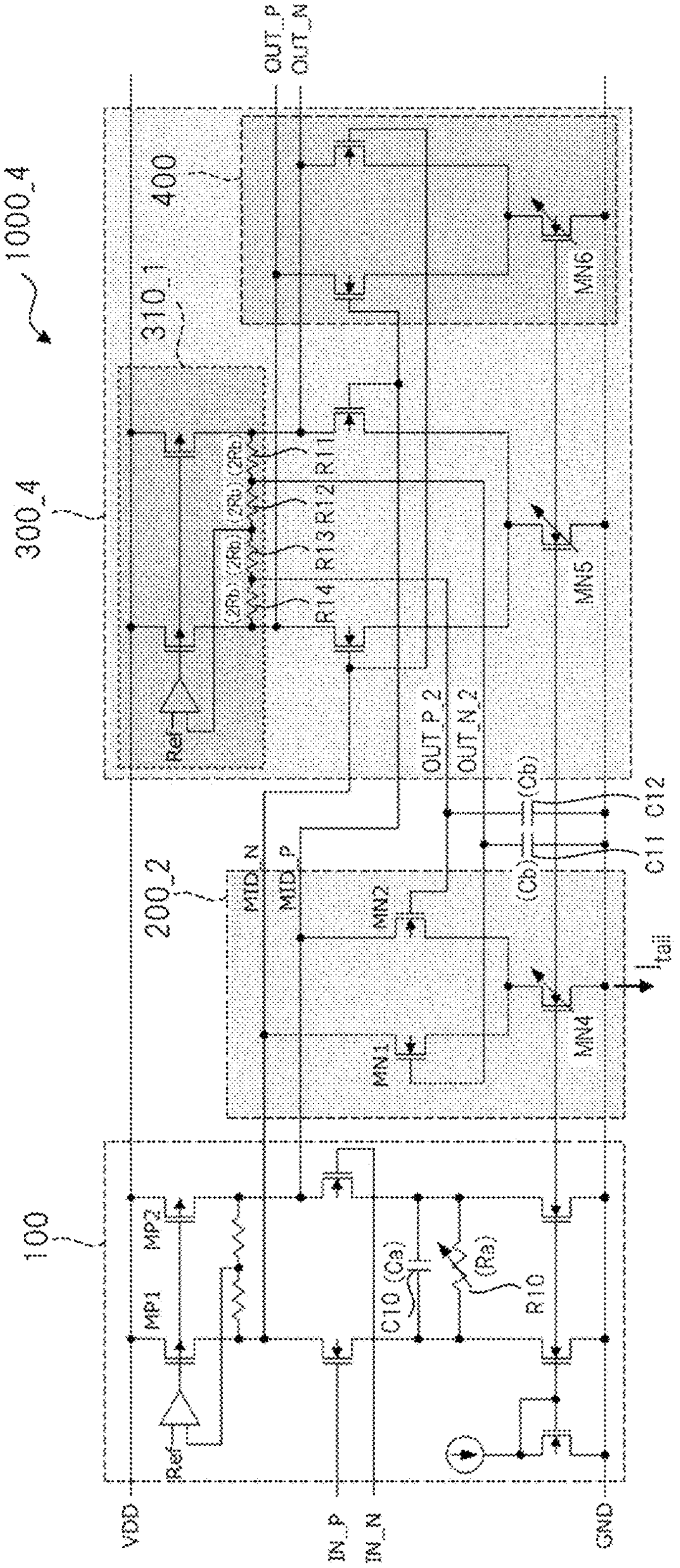
FIG. 10 is an exemplary circuit diagram of a differential amplifier circuit having a function of a CTLE having two zeros according to Embodiment 4.

(Embodiment 4) FIG. 10 is a circuit diagram showing a circuit configuration of a differential amplifier circuit 1000_4 having a function of CTLE having two zeros according to the fourth embodiment. The differential amplifier circuit 1000_4 having CTLE function of FIG. 10 includes a feedback path including a first differential amplifier circuit 100, a feedback differential circuit 200_2, a second differential amplifier circuit 300_4, a resistor R11 to R14, and a capacitor C11, C12. The differential amplifier circuit 1000_4 having CTLE function also includes a gain adjusting circuit 400. When the external load connected to the CTLE 1000_4 changes, the gain of the differential amplifier 1000_4 having CTLE function may also need to be changed in accordance with the load. In such cases, the gain of the CTLE1000_4 can be appropriately adjusted by changing the current of the transistors MN5 and MN6 of the second differential amplifier 300_4 to adjust the gain. When the gain of the second differential amplifier circuit 300_4 is changed to change the amplitude of the feedback signals OUT_P_2 and OUT_N_2, the following processing is executed. That is, by adjusting the output current Itail of the transistor MN4, the input dynamic range of the feedback differential circuit 200_2 can be adjusted as shown in Equation (2).

According to the differential amplifier circuit of the fourth embodiment described above, it is possible to achieve the effect of the differential amplifier circuit of the first embodiment. Further, even in an environment in which the external loads connected to the output stage of the differential amplifier circuit according to the fourth embodiment differ, the gain adjusting circuit can function as a CTLE by adding the gain adjusting circuit to the output stage of the differential amplifier circuit according to the fourth embodiment. Further, even if the amplitude of the feedback signal of the differential amplifier circuit according to the fourth embodiment increases, the input dynamic range of the feedback differential circuit can be adjusted by adjusting Itail of the feedback differential circuit.

Figure 11:
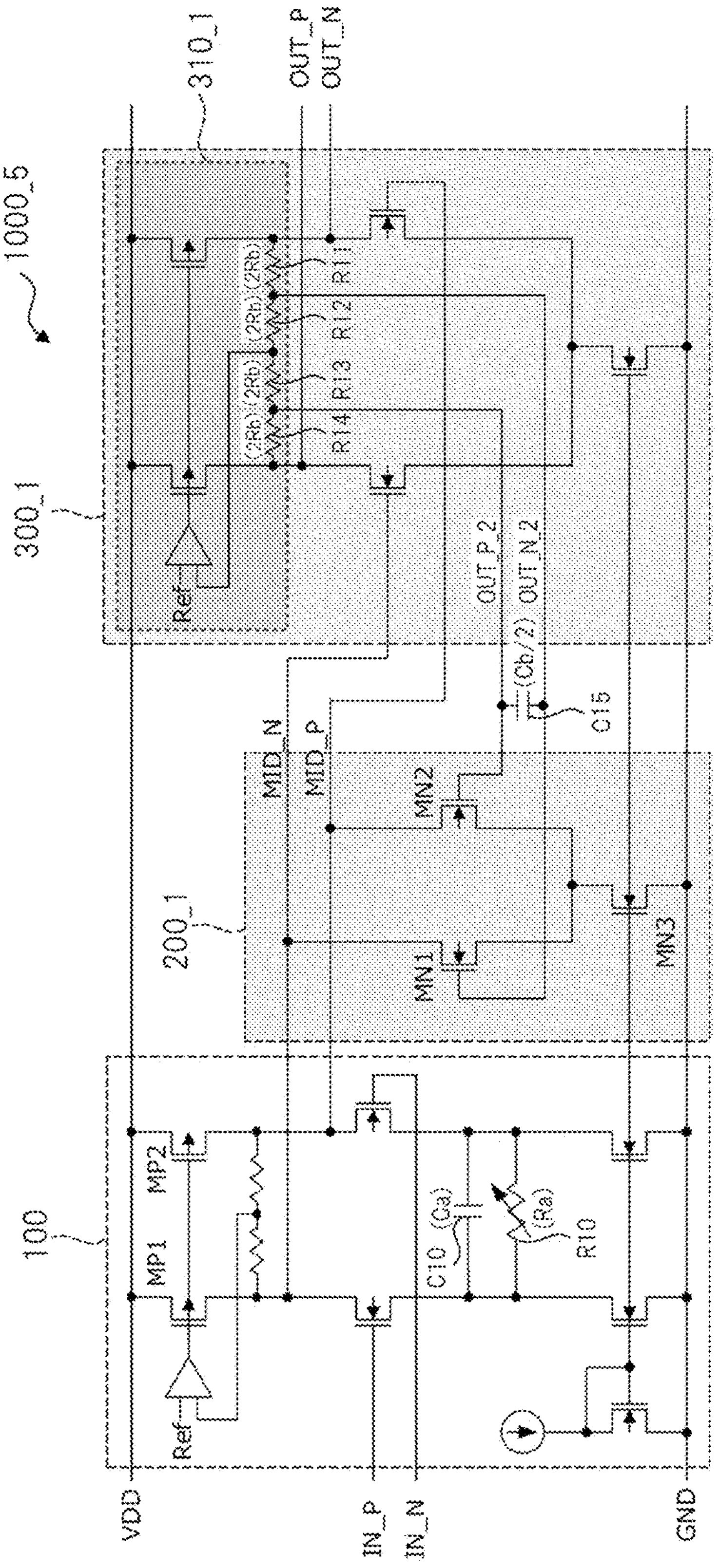
FIG. 11 is an exemplary circuit diagram of a differential amplifier circuit having a function of a CTLE having two zeros according to Embodiment 5.

FIG. 11 is a circuit diagram showing a circuit configuration of a differential amplifier circuit 1000_5 having a function of a CTLE having two zeros according to the fifth embodiment. The differential amplifier circuit 1000_5 having CTLE function of FIG. 11 includes a feedback path including a first differential amplifier circuit 100, a feedback differential circuit 200_1, a second differential amplifier circuit 300_1, a resistor R11 to R14, and a capacitor C15. Instead of arranging the capacitors of the feedback path relative to GND, they are arranged between the differential between the feedback signals OUT_P_2 and OUT_N_2. If the second zero point is not moved, by arranging a capacitor having a capacitor capacitance of half the capacitor capacitance that was arranged with respect to GND between the differential, it is possible to exhibit the same function as the differential amplifier circuit 1000_1 having the function of CTLE having two zero points according to the first embodiment. In this case, since the number of capacitors arranged in the feedback path and the capacitance of the capacitor can be reduced, CTLE can be miniaturized.

According to the differential amplifier circuit of the fifth embodiment described above, it is possible to achieve the effect of the differential amplifier circuit of the first embodiment. Further, instead of arranging the capacitor of the feedback path with respect to GND, by arranging between the differential between the feedback signals, it is possible to reduce the number of capacitors and the capacitance of the capacitor, it is possible to reduce CTLE.

Although the invention made by the present inventors has been described in detail based on the embodiments, it is needless to say that the present invention is not limited to the above-described embodiments and can be variously modified without departing from the gist thereof. Further, for example, the above-described embodiments have been described in detail for the purpose of illustrating the present invention easily, and are not necessarily limited to those having all the described configurations. Further, it is possible to add, delete, or replace a part of the configuration of the above-described embodiment with another configuration.

What is claimed is:

1. A differential amplifier circuit comprising:

a first differential amplifier circuit as a first stage;

a second differential amplifier circuit having a common mode feedback circuit in a second stage; and a feedback differential circuit configured to multiply a differential signal between a differential output of the first differential amplifier circuit and a differential input of the second differential amplifier circuit by a magnitude of a differential output of the common mode feedback circuit, wherein:

the differential input of the feedback differential circuit is provided with a feedback path configured to input the differential output of the common mode feedback circuit via a filter circuit formed between a ground, the common mode feedback circuit is configured to divide the differential output of the second differential amplifier circuit and includes a voltage dividing resistor for extracting a common mode signal, the common mode feedback circuit includes:

a dividing terminal configured to divide the voltage dividing resistor provided as a common mode signal extraction terminal for extracting the common mode signal;

a first output terminal provided between the common mode signal extraction terminal and one terminal of the voltage dividing resistor; and a second output terminal provided between the common mode signal extraction terminal and another terminal of the voltage dividing resistor, and the voltage dividing resistor performs as a resistor constituting the filter circuit.

2. The differential amplifier circuit according to claim 1, wherein:

the filter circuit performs as a low-pass filter having a capacitor formed between the filter circuit and the ground, the first output terminal is configured to divide a resistance between the common mode signal extraction terminal and one end of the voltage dividing resistor; and the second output terminal is configured to divide a resistance between the common mode signal extraction terminal and another end of the voltage dividing resistor.

3. The differential amplifier circuit according to claim 1, wherein:

the filter circuit performs as a low-pass filter having a capacitor formed between the filter circuit and the ground, and a ratio of a resistance between the first output terminal to the common mode signal extraction terminal and the resistance of one terminal of the voltage dividing resistor is configured to equalize to the ratio of the resistance between the second output terminal to the common mode signal extraction terminal and another terminal of the voltage dividing resistor.

4. The differential amplifier circuit according to claim 3, the common mode feedback circuit further comprises:

a first variable resistance between the first output terminal and the capacitor; and a second variable resistance between the second output terminal and the capacitor, wherein the differential amplifier circuit is configured to adjust a time constant of the filter circuit by changing resistance values of the first variable resistance and second variable resistance.

5. The differential amplifier circuit according to claim 1, further comprises a gain adjustment circuit configured to adjust a gain of the differential output of the second differential amplifier circuit, wherein the feedback differential circuit is further configured to be adjusted a bias current in accordance with gain adjustment of the gain adjustment circuit.

6. The differential amplifier circuit according to claim 1, wherein the filter circuit performs as a low-pass filter having a capacitor formed between the filter circuit and the ground.

* * * * *